(12) United States Patent
Zhu

(10) Patent No.: US 10,126,398 B2
(45) Date of Patent: Nov. 13, 2018

(54) MODELING AND VALIDATION FOR COMPRESSED SENSING AND MRI

(71) Applicant: Yudong Zhu, Scarsdale, NY (US)

(72) Inventor: Yudong Zhu, Scarsdale, NY (US)

(*) Notice: Subject to any disclaimer, the term of this patent is extended or adjusted under 35 U.S.C. 154(b) by 762 days.

(21) Appl. No.: 14/588,938

(22) Filed: Jan. 3, 2015

(65) Prior Publication Data

US 2015/0192654 A1     Jul. 9, 2015

Related U.S. Application Data

(60) Provisional application No. 61/923,236, filed on Jan. 3, 2014.

(51) Int. Cl.
*G01V 3/00* (2006.01)
*G01R 33/561* (2006.01)

(52) U.S. Cl.
CPC ............... *G01R 33/5611* (2013.01)

(58) Field of Classification Search
USPC ............................................. 324/309
See application file for complete search history.

(56) References Cited

U.S. PATENT DOCUMENTS

| | | | |
|---|---|---|---|
| 6,841,998 B1 | 1/2005 | Griswold | |
| 7,602,183 B2 | 10/2009 | Lustig et al. | |
| 7,646,924 B2 | 1/2010 | Donoho | |
| 7,688,068 B2 | 3/2010 | Beatty | |
| 8,379,951 B2 | 2/2013 | Lustig et al. | |
| 2007/0182411 A1* | 8/2007 | Bammer | G01R 33/4824 324/307 |
| 2009/0069664 A1* | 3/2009 | Kim | G01R 33/561 600/410 |
| 2011/0084693 A1 | 4/2011 | Kholmovski et al. | |
| 2012/0099774 A1 | 4/2012 | Akcakaya et al. | |
| 2014/0086469 A1 | 3/2014 | Lefebvre et al. | |
| 2014/0286560 A1 | 9/2014 | Trzasko et al. | |
| 2014/0376794 A1 | 12/2014 | Dumoulin et al. | |

OTHER PUBLICATIONS

Lustig, et al, "Sparse MRI: The Application of Compressed Sensing for Rapid MR Imaging," Magnetic Resonance in Medicine, vol. 58, pp. 1182-1195, 2007.
Lustig, et al, "Calibrationless Parallel Imaging Reconstruction by Structured Low-Rank Matrix Completion," Proc Intl Soc Mag Reson Med, p. 2870, 2011.
Uecker, et al, "ESPIRiT—An Eigenvalue Approach to Autocalibrating Parallel MRI: Where SENSE Meets GRAPPA," Magnetic Resonance in Medicine, vol. 71, pp. 990-1001, 2013.
Zhang, et al, "Parallel Reconstruction Using Null Operations," Magnetic Resonance in Medicine, vol. 66, pp. 1241-1253, 2011.

* cited by examiner

*Primary Examiner* — Rodney Fuller

(57) ABSTRACT

A method judiciously applies or manages randomness, incoherence, nonlinearity and structures for improving signal encoding or decoding. The method in a compressed sensing-based imaging example comprises acquiring a set of base data samples, obtaining a base result, perturbing the base set, obtaining perturbed result(s), and deriving an outcome facilitating assessment and improvement of image quality. The method in a magnetic resonance imaging example comprises acquiring data samples in parallel and in accordance with a k-space sampling pattern, identifying a signal structure in an assembly of the acquired data samples, and finding a result consistent with both the acquired data samples and the identified signal structure.

20 Claims, 12 Drawing Sheets

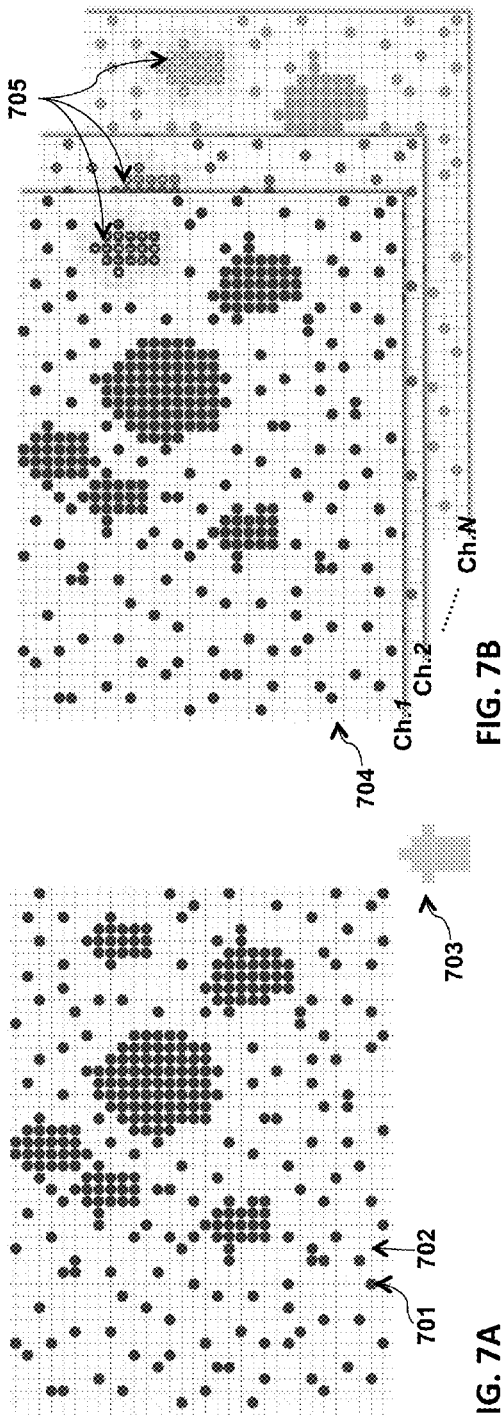
FIG. 7A
FIG. 7B
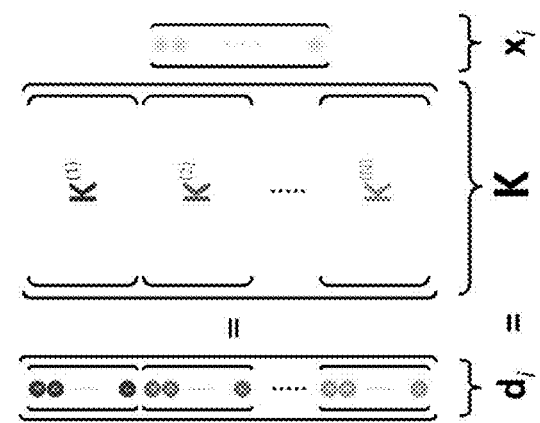
FIG. 7D
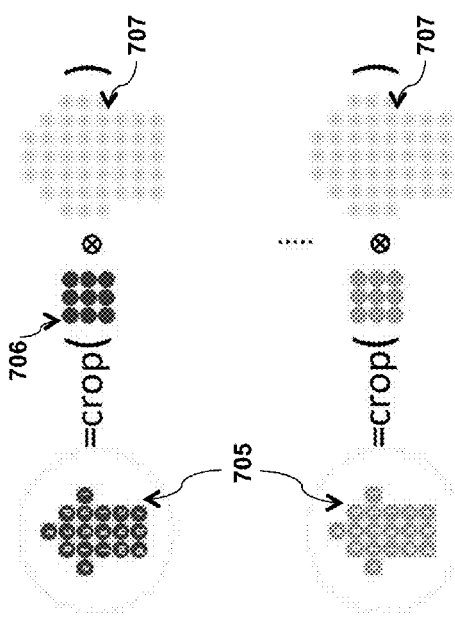
FIG. 7C

FIG. 8A

$\left\{\begin{array}{l}\text{Equations expressing conformity with the signal structure }^{\ddagger}\\ \text{Equations expressing conformity with measured data samples}\\ \text{Equations expressing conformity with additional models}\end{array}\right.$ $^{\ddagger}$ Examples:

$\left\{\begin{array}{l}z^{(1)} = w^{(1,1)} \otimes z^{(1)} + w^{(1,2)} \otimes z^{(2)} + \ldots + w^{(1,N)} \otimes z^{(N)}\\ \vdots\\ z^{(N)} = w^{(N,1)} \otimes z^{(1)} + w^{(N,2)} \otimes z^{(2)} + \ldots + w^{(N,N)} \otimes z^{(N)}\end{array}\right.$ and $\left\{\begin{array}{l}y^{(1)} = W^{(1,1)} \times y^{(1)} + W^{(1,2)} \times y^{(2)} + \ldots + W^{(1,N)} \times y^{(N)}\\ \vdots\\ y^{(N)} = W^{(N,1)} \times y^{(1)} + W^{(N,2)} \times y^{(2)} + \ldots + W^{(N,N)} \times y^{(N)}\end{array}\right.$

FIG. 8B

Find a set of values for the unknowns that minimizes:

a metric on deviation from the signal structure model
+a metric on deviation from the measurements
+penalty term(s) based on additional model(s)

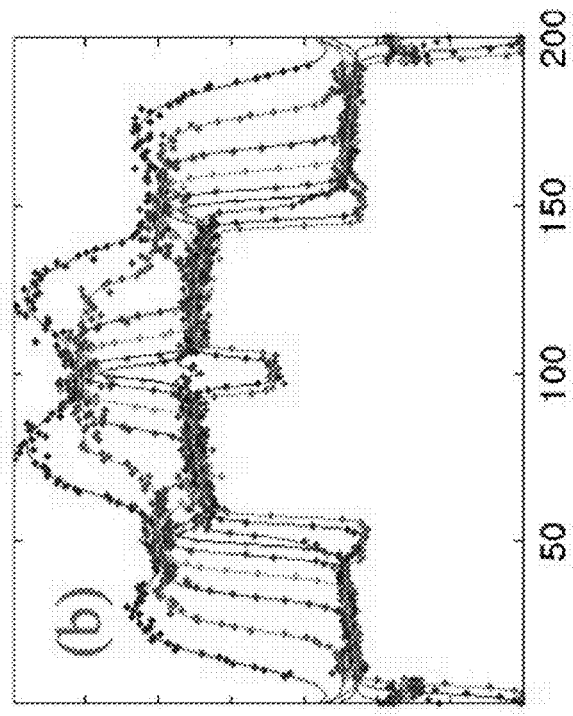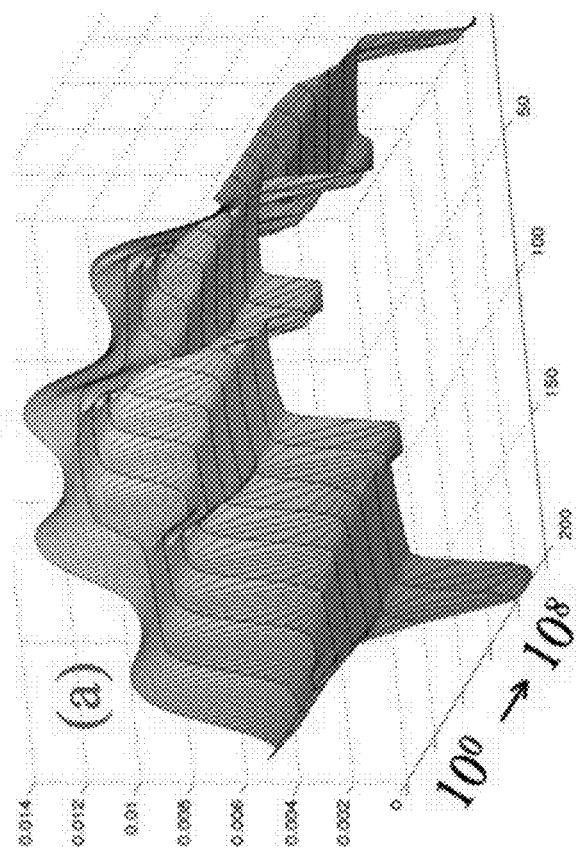
FIG. 10

MODELING AND VALIDATION FOR COMPRESSED SENSING AND MRI

This application claims the benefit of PPA Application No. 61/923,236 filed 3 Jan. 2014 by the present inventor, which is incorporated by reference.

BACKGROUND

Mathematical modeling based on physics, statistics or other knowledge is essential to performance of signal encoding and decoding.

Built upon unique signal models and reconstruction algorithms, as well as random or incoherent sampling, a new class of methods promise to encode and decode one- or multi-dimensional signals with a significantly reduced amount of measured, transmitted or stored data samples, and be effective managing interference effects due to random noise and aliasing. Representative methods of the new class include compressed sensing and low-rank matrix completion.

Examples of success abound demonstrating compressed sensing and low-rank matrix completion in various applications. Theoretical analyses offer not only insights on their statistical behavior but asymptotic performance guarantees under certain conditions. For certain applications however, assessment of fidelity or reliability of a specific encoding and decoding instance, as opposed to assertion of performance in a general or statistical manner, is crucial.

A case in point is compressed sensing in diagnostic MRI application. While there are numerous examples demonstrating compressed sensing's success in accelerating MR data acquisition or improving image signal-to-noise ratio (SNR), in reading an image obtained in a specific imaging instance, it is not uncommon for one to have a lingering concern that the underlying imaging scheme might have, in a convoluted and subtle manner, obscured some diagnostically important features. Setting up compressed sensing for accelerated MR data acquisition can be a complex and poorly guided process. Compared to conventional imaging schemes that rely principally on linear operators, a compressed sensing scheme, with at its core a nonlinear operator that leverages both random sampling and a sparse model to disentangle signals from interferences, poses more challenges to gauging the level of image fidelity. This is because the scheme's response to signal, interferences and encoding/decoding parameters is difficult to grasp or interpret. Sometimes a false sense of confidence may even present, as the scheme tends to produce "clean-looking" images, with interference effects spread and with no conspicuous artifacts alerting the existence of fidelity issues. When leveraging sparse modeling in diagnostic MRI therefore, there are vital needs for imaging quality control.

Parallel MRI is a subcategory of MRI. Compressed sensing is certainly applicable. Yet owing to the multi-sensor setup, imaging physics further implies redundancy/structure in the signal. There are significant opportunities for devising and optimizing mathematical modeling and for improving imaging speed, SNR and quality.

In accordance with the present invention methods are provided that judiciously apply/manage randomness, incoherence, nonlinearity and structures involved in signal encoding or decoding. In practice, where extra data for validation or comparison is often unavailable, embodiments of the invention address vital quality control needs in sophisticated encoding and decoding with unique validations and guidance, paving the way for proper and confident deployment of new encoding and decoding in applications demanding high fidelity. In multi-sensor practice, embodiments of the invention further exploit signal structures for gains in performance of signal encoding and decoding. Embodiments are illustrated for the diagnostic MRI application, and include, for example, assessment and improvement of image quality with self-validations that can be automatically performed on any specific imaging instance itself, without necessitating additional data for validation or comparison. Embodiments illustrated also include other assessments and improvements, and parallel MRI that leverages signal structures.

BRIEF DESCRIPTION OF THE DRAWINGS

FIG. 7A-7D illustrate a parallel acquisition signal structure in an MRI example.

FIG. 8A-8B illustrate example reconstruction formulations.

FIG. 10 is an illustration of predicted and measured noise standard deviation in an example.

DETAILED DESCRIPTION

Figure 1:
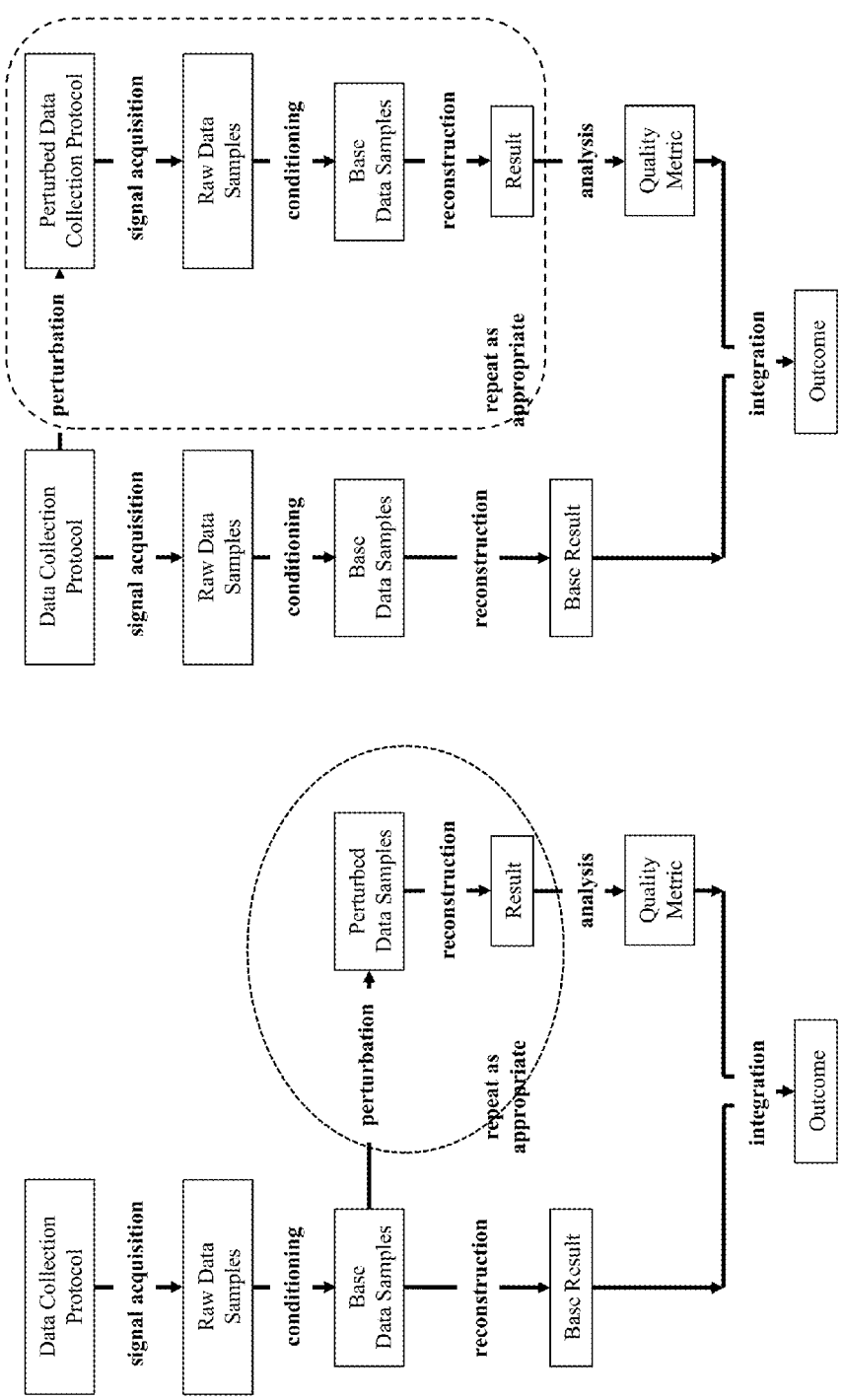
FIG. 1A-1B show high-level flow charts in accordance with aspects of the present invention.

The Prospect of MRI with Accompanying Fidelity Assessment

Compressed sensing and low-rank matrix completion provide a capacity for speeding up data acquisition while keeping aliasing and noise effects subdued. Theories and experiences however are yet to establish a more robust guidance on random sampling, sparse model and non-linear solver, to help manage the challenge of using the technology in diagnostic MRI.

Fidelity tests described in the next several sections are devised to detect quality issues, including ones that are difficult to spot by inspecting, alone, image(s) in an MRI instance. The foundation for the tests include: a) Critical reliance on a nonlinear operator in reconstruction calls for at least a validation of the operator's response at or near the operating point (as set by the acquired data, among others). b) Small perturbations to the imaging instance should not significantly impact its result if the instance is intrinsically robust or reliable. c) Linear response to image features is essential to contrast fidelity. d) From the perspective of compressed sensing or low-rank matrix completion, random or incoherent sampling implies that equivalence exist among different sampling patterns (for example, two sets of k-space locations both selected uniformly at random can yield identical reconstruction results).

Regarding bullet d, the principle of compressed sensing or low-rank matrix completion, especially the required randomness or incoherence of the k-space sampling, is a unique facilitating factor for the fidelity assessment of reconstructed images. Unlike conventional sampling and reconstruction schemes, the essential randomness in sampling allows one to compare and evaluate results obtained from equally valid random k-space sampling and thereby provide indications about the fidelity of reconstructed images. Here is an intuitive example. For any given compressed sensing or low-rank matrix completion based scheme that involves randomly acquiring M k-space samples, one acquires one (or several) extra randomly to make it P samples. During image reconstruction one can then form many equally valid M-sample subsets by randomly leaving out one (or several) samples. The differences amongst the reconstruction results that correspond to the subsets contain information on the robustness of the original M-sample based scheme. Statistical tests of the results can be performed to assess the significance of the differences. Various metrics can be derived to serve as fidelity indicators. The extra cost in acquisition time can be negligible in this example.

In accordance with aspects of the invention, L- and S-tests address quality control challenge from a unique angle. In a general setting, or in a particularly relevant setting where additional data for validation/comparison is much desired but not readily available, these new tests can be invoked to derive fidelity indicators from the data and the reconstruction themselves, and to enable guided further improvements. As existing imaging examples have suggested, the ingredients of compressed sensing and low-rank matrix completion can accommodate linear response and contrast fidelity for a range of setups. The straightforward L-test helps detect if a specific setup is over the range or the resulting image is unreliable. The intrigues of compressed sensing and low-rank matrix completion are exploited to establish unique mechanisms for additional self-validations. With a framework involving one or more levels of randomness, the S-test helps detect if and where flaws exist in an otherwise clean looking image.

Conditioning

To facilitate a solution or improve performance, one can apply conditioning to the original set of raw data samples. This entails transforming the original set of raw data samples into a set of base data samples in a same or alternate space, e.g., image space, Fourier transform space (k-space) and wavelet transform space, where the set of base data samples exhibits desirable characteristics, e.g., uncorrelated noise, reduced amount and enhanced SNR. It is typically preferable to apply conditioning prior to more sophisticated processing. FIG. 1 shows two examples. If conditioning is not applied the set of base data samples is identical to the original set of raw data samples.

When methods such as compressed sensing and low-rank matrix completion are used in applications that involve data samples from multiple sensors or channels working in parallel, conditioning applied to raw data samples can help improve performance. In an exemplary embodiment, the covariance matrix of the measurement noise associated with the multiple sensors is acquired, and a linear transform is determined and applied to the multi-sensor raw data samples. For example, eigenvalue decomposition or singular value decomposition of the covariance matrix gives $\Lambda^{-1/2}V^H$ as the linear transform operator. The result is a set of base data samples associated with multiple new sensors that are numerically synthesized by the transform, where noise covariance matrix of the new sensors is an identity matrix.

Rendering noise uncorrelated and similarly distributed helps advanced reconstruction methods manage noise interference effects. The new parallel MRI methods described in later sections function with or without conditioning, unless specifically noted.

Linear Response Test (L-Test)

As many imaging examples have suggested, the ingredients of compressed sensing can accommodate linear response and contrast fidelity for a range of setups. Some other methods that involve nonlinear operators, including low-rank matrix completion and MR finger printing, also support linear response and contrast fidelity to a certain extent. A linear response test (L-test) helps detect if a specific setup is outside an acceptable range or the resulting image is unreliable.

An exemplary embodiment is hereby described, using a compressed sensing example. An indication of an imaging scheme's inability to linearly track a local signal change shall call into question the accuracy of image contrast/feature at that location. To capture such indications an L-test checks the difference between an image in the original MRI instance (base result) and an image reconstructed from perturbed k-space data that correspond to adding a predetermined image feature, in accordance with the framework illustrated by FIG. 1A. For example the test checks the difference between a pair of results from, respectively:

$$\operatorname*{argmin}_{m} \|\mathcal{F}_u m - y\|_2^2 + \lambda \|\Psi m\|_1 + \alpha TV(m) \quad \text{[Exemplary equation 1a]}$$

$$\operatorname*{argmin}_{m} \|\mathcal{F}_u m - (y + \mathcal{F}_u g^{(i)})\|_2^2 + \lambda \|\Psi m\|_1 + \alpha TV(m) \quad \text{[Exemplary equation 1b]}$$

where $g^{(i)}$ represents a "bump" added to the true image around voxel i. An example choice for $g^{(i)}$ may be a 5×5 Hamming window profile centered at voxel i. Through $\mathcal{F}_u$, the under-sampled Fourier transform, the perturbation is inflicted broadly in k-space. At voxel i, deviation of the value of the difference from that of the "bump" indicates nonlinearity in local signal recovery. Sweeping a region and recording the deviation voxel-by-voxel creates a deviation-from-linearity map that flags contrast fidelity issue in the region. Ideally the reconstruction result responds linearly to the measured data y, which preserves contrast and ensues zero deviation. The sampling pattern, sparse model and numerical solver involved in a specific imaging instance however may situate the signal recovery scheme in a nonlinear regime, causing deviation detectable by an L-test.

Figure 3:
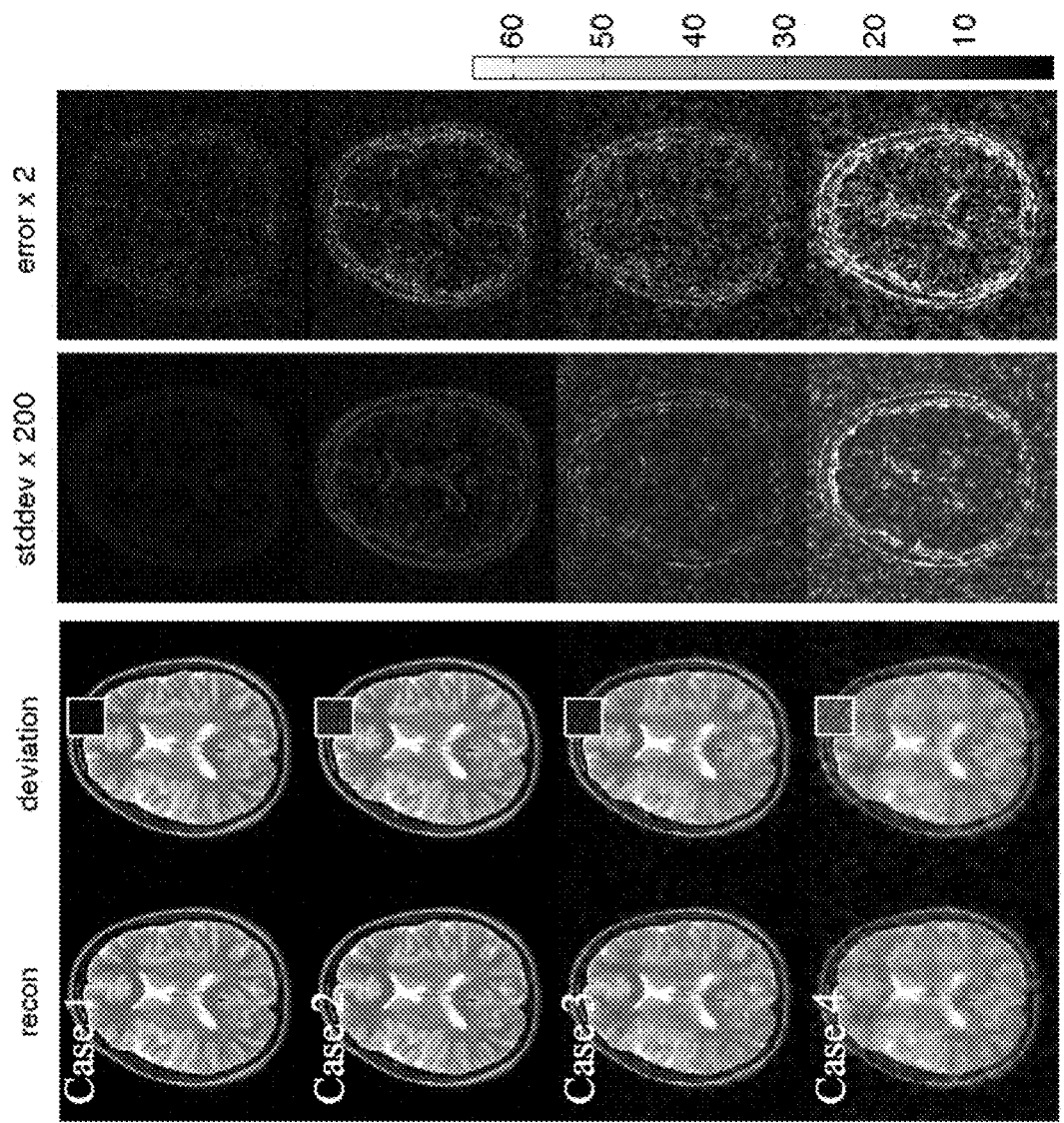
FIG. 3 is an illustration of improved compressed sensing with the introduction of self-validation tests.

FIG. 3 illustrates, with an MRI example, improved compressed sensing with the introduction of L-tests. In acceleration of 2D phase encoding in MRI of a brain, the k-space's 256×256 grid was sampled with patterns that correspond to various acceleration factors, fully-sampled center k-space radii and probability density functions—Case 1: 2-fold acceleration and r=0.32, Case 2: 4-fold acceleration and r=0.32, Case 3: 2-fold acceleration and r=0, and Case 4: 4-fold acceleration and r=0.02. FIG. 3 col. 1 shows the compressed sensing reconstruction results. FIG. 3 col. 2 displays, over the tested region (marked), the deviation-from-linearity maps from performing L-tests voxel-by-voxel over the region (Eqn. 1). Notice the near zero deviation in Case 1, modestly elevated deviation in Case 2 (higher acceleration) and Case 3 (smaller fully-sampled center k-space), and significant deviation in Case 4 (both higher acceleration and smaller fully-sampled center k-space).

Sampling Test (S-Test)

The intrigues of compressed sensing and low-rank matrix completion support unique mechanisms for further self-validations. Aside from the intuitive example given earlier, a notion that more is not necessarily better—think of the challenge a regular under-sampling poses to aliasing effect management—also inspired the idea of excluding one or a few data samples from a specific reconstruction instance. An S-test implements the idea, and can be carried out using the framework illustrated by FIG. 1A to detect if and where flaws exist in an otherwise clean looking original image (base result).

The S-test may involve local perturbations to the sampled space. In particular, an instance of perturbation to the set of base data samples is realized by excluding L selected samples, where L≥1 and the selection strategy can be one of random, deterministic, or hybrid (i.e., deterministic for certain sampling locations and random for the rest). Reconstruction based on the perturbed set leads to a result carrying additional, useful information. Repeating the perturbation-reconstruction Q times (FIG. 2) leads to an ensemble of results. When Q is sufficiently large the bits of additional information carried by the individual results are pooled together to derive metrics that indicate the quality of, or guide the improvement over, the original image.

In an exemplary embodiment of compressed sensing with self-validation, an S-test checks variations in reconstruction results amongst an ensemble of compressed sensing reconstructions that each uses a leaving-L-out version of the set of base data samples. For example the S-test checks standard deviation of the solutions to the following ensemble of magnetic resonance image reconstruction problems:

$$\operatorname*{argmin}_{m} \|\mathcal{F}_u^{(j)} m - y^{(j)}\|_2^2 + \quad \text{[Exemplary equation 2]}$$

$$\lambda \|\Psi m\|_1 + \alpha TV(m),$$

$$j = 1, 2, \ldots$$

where $\mathcal{F}_u^{(j)}$ and $y^{(j)}$ correspond to the jth instance of leaving one k-space data sample out (i.e., L=1). Conceptually, if M randomly sampled k-space data samples are more than adequate for a full reconstruction, randomly leaving one sample out without altering the original sampling probability density function may not impact the reconstruction. Along this line of reasoning a significant variation detected by an S-test is an indication that the original imaging instance's result is not reliable. From a more general perspective, excessive sensitivity of a reconstruction's result to perturbation is never a good sign, and a metric that tracks sensitivity and flags excessiveness is most desirable.

An exemplary embodiment of low-rank matrix completion with self-validation is presented in a later section following discussions of parallel MRI signal structure.

FIG. 3 further illustrates improved compressed sensing with the introduction of S-tests. For each of the cases in the same MRI example, the S-test involved a 500-instance ensemble, where each instance used all k-space samples of the case except one sample that was randomly selected outside the fully-sampled center k-space. FIG. 3 col. 3 summarizes the S-test results in the form of standard deviation maps. FIG. 3 col. 4 shows the actual error (the difference between true and reconstructed images). The variations uncovered by the tests (col. 3) were rather revealing of the actual error (col. 4) in terms of severity level and spatial distribution. Notice the power of the quantitative tests in assessing/guiding MRI—in actual practice where few clues other than the measured data are available, a comparatively high variation value reported would indicate a quality issue and further guide adjustment of reconstruction/acquisition. In Cases 1-4, the root mean square of the actual error were 2%, 3%, 4% and 7% of peak image intensity respectively, and the root mean square of the standard deviation values were 0.01%, 0.02%, 0.04% and 0.06% of peak image intensity respectively. All plots of FIG. 3 used a common gray scale. For each of the cases the lead principal component obtained from SVD of the ensemble of instances (not shown) also appeared to be indicative of the case's actual error pattern.

Further Considerations on L- and S-Tests

An alternative framework, as illustrated by FIG. 1B, can be used for applying L- and S-tests. The perturbation is applied to the data collection protocol. This may involve acquisition of more data but offers vast flexibility imposing various test conditions, which allows probing, validating or evaluating more aspects of the encoding and decoding. For example, result variation arising from perturbation to the ordering/timing of data acquisition can be a useful indicator when validating, evaluating or improving the practice of MR finger printing.

Figure 2:
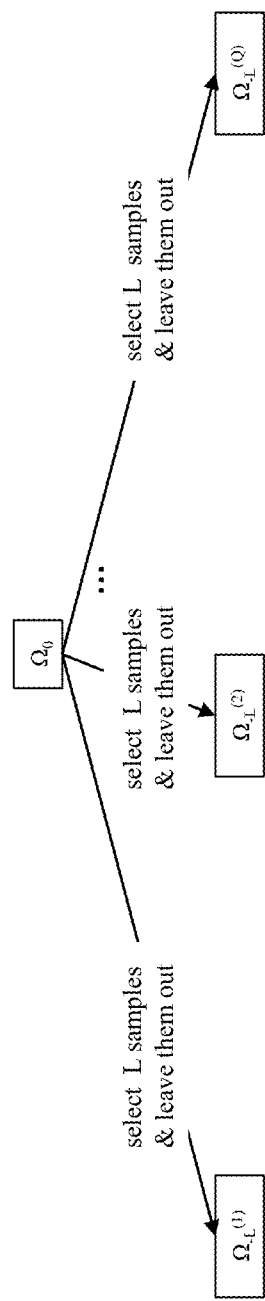
FIG. 2 is an illustration of an exemplary Sampling Test.

For each instance of an S-test, FIG. 2 includes the arrangement of leaving more than one samples out per parallel receive channel or letting different channels skip same or different k-space locations.

Figure 4:
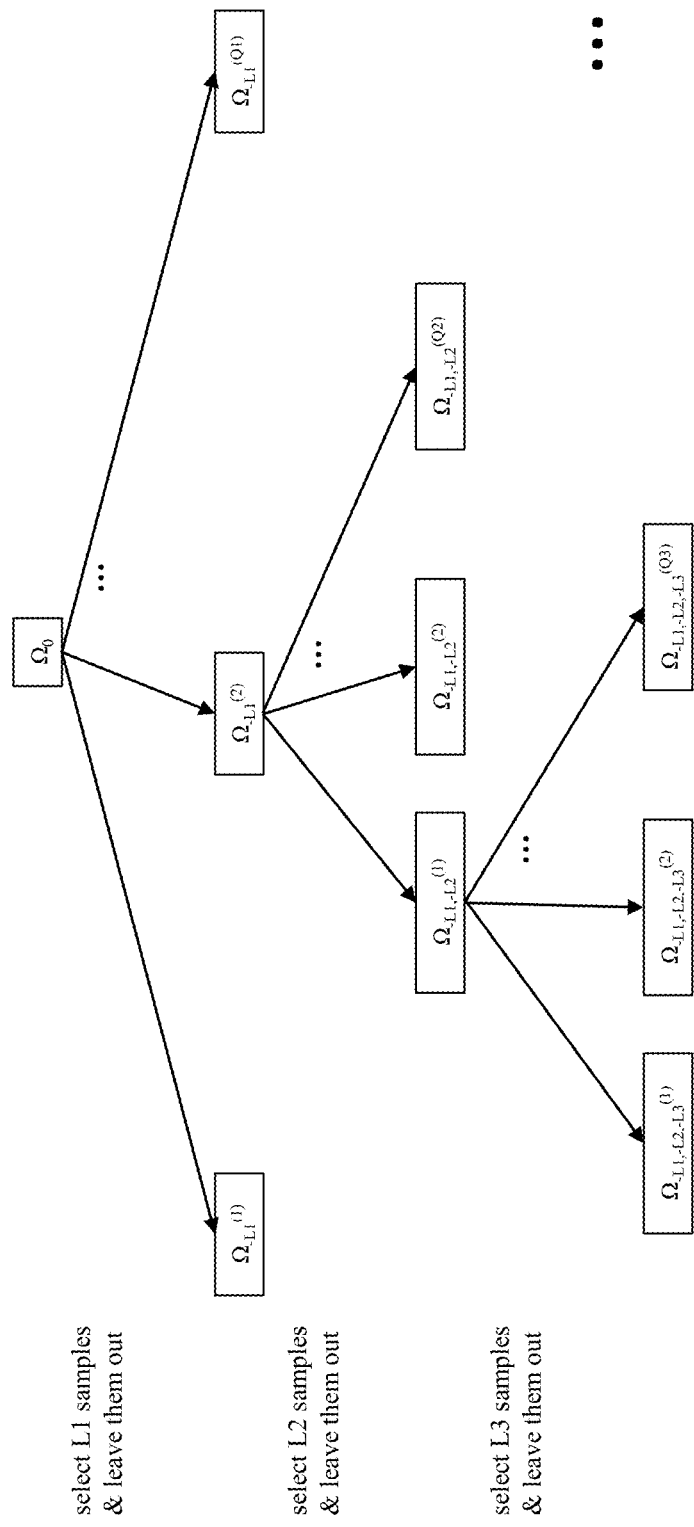
FIG. 4 is an illustration of an exemplary multi-level Sampling Test.

Note that S-tests can be applied at multiple levels, in a leaving-L-out hierarchy, as illustrated by FIG. 4. Tracking the variation values throughout the hierarchy and analyzing exhibited trends can provide additional assessments. For instance, for any given voxel the variation value as a function of number of samples left out, corresponding to a certain sequence of branches tracing down the hierarchy, may reveal that the reconstruction evolves from working well to breaking down eventually, or behaves unreliably even with the use of all samples, or assumes a deterioration pattern with a critical point. The test summary can be in the form of an image, with each voxel value equaling a metric calculated from the voxel's corresponding variation value curve.

Use of real/virtual phantoms, in which the voxel values corresponding to the phantoms are known or independently measurable, may help derive an approximate scaling factor that relates the S-test predicted error level to the actual error level. Such a scaling factor for example, is calculated by dividing the deviation of a reconstructed voxel value from the known or independently measured, by a corresponding standard deviation reported in the S-test.

Given the task of imaging a specific, unknown object, no sampling pattern instance is likely to guarantee maximum effectiveness recovering signals from interferences. Rather, an ensemble of reconstructions, each using a random leaving-L-out version of an original set of acquired k-space data, collectively can have a good chance of detecting features that happen to be obscured by a reconstruction using the original set. Accordingly devised schemes can be applied for retrospective or prospective fixes, accomplishing un-distortion or recovery of such features.

Figure 5:
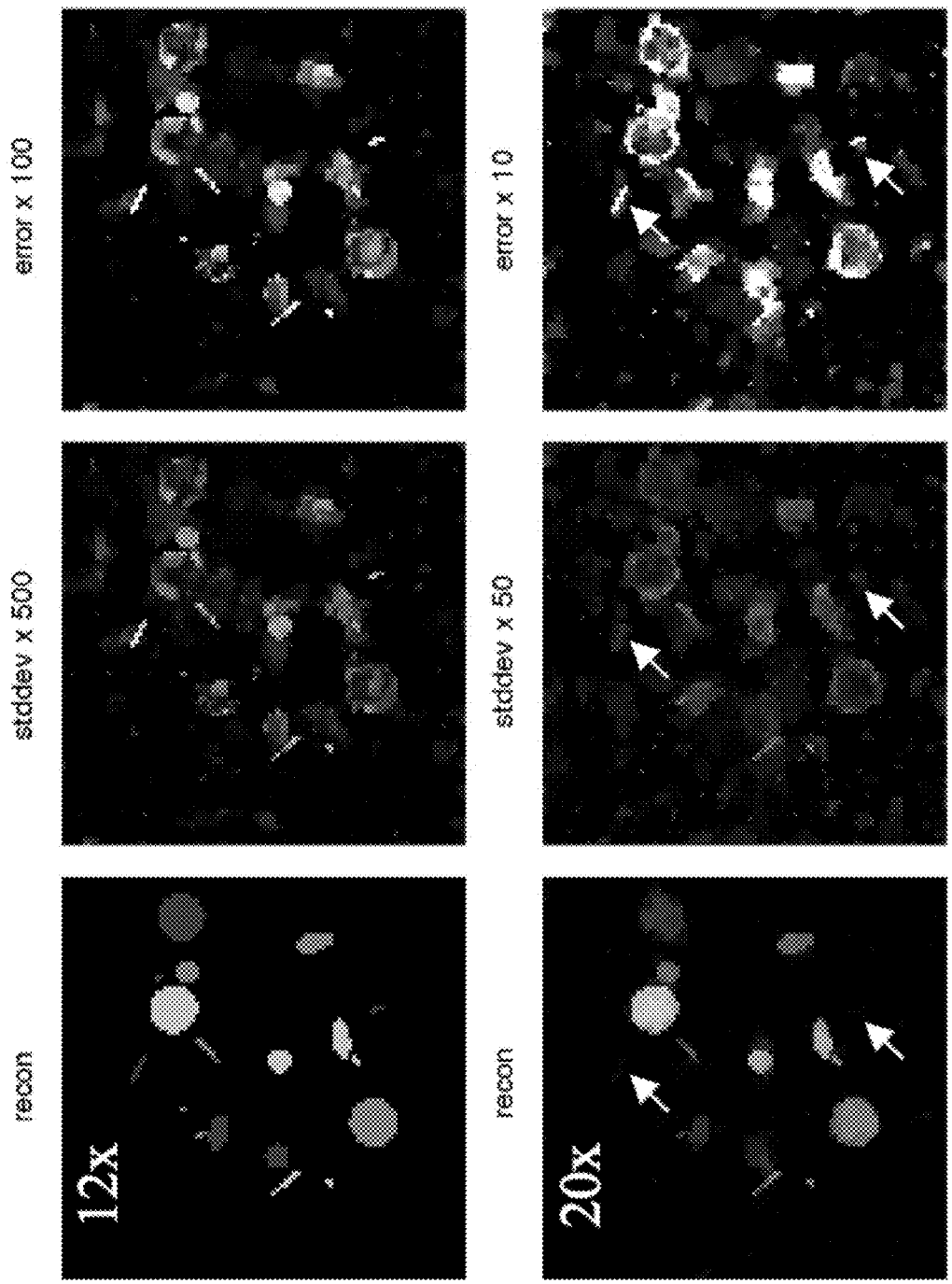
FIG. 5 is an illustration of improved compressed sensing with the introduction of self-validation tests.

FIG. 5 illustrates, with an MR angiogram simulation example, improved compressed sensing with the introduction of self-validation tests. From left to right FIG. 5 shows the compressed sensing results (left column), the standard deviation maps from S-tests (mid column), and the actual error (right column). The top and bottom rows correspond, respectively, to cases employing 12-fold and 20-fold accelerated variable density k-space sampling. Notice again S-tests' power in tracking actual errors. The loss of two low-contrast features in the 20-fold case for instance, was detected by the standard deviation map.

Improving Image Reconstruction Using Known Features

Use of real or virtual, known features or structures can benefit a complex/nonlinear reconstruction. In an exemplary embodiment, one adds real or virtual, known features in the image space. Adding virtual features is accomplished by accordingly updating all k-space data samples. One then uses accurate recovery of the known features as a constraint or target during the reconstruction. The constraint or target tends to regularize the reconstruction, and the feature addition allows some adjustment of the operating point the complex/non-linear reconstruction is situated at.

An example is hereby described illustrating an implementation of the idea in compressed sensing:

$$\underset{m}{\mathrm{argmin}} \|\mathcal{F}_u m - (y + \mathcal{F}_u g)\|_2^2 + \qquad \text{[Exemplary equation 3]}$$

$$\beta \|\Omega_g m - g\|_2^2 + \lambda \|\Psi m\|_1 + \alpha TV(m)$$

In Eqn. 3, g represents a virtual, known feature numerically added. Update of all k-space data samples is through $\mathcal{F}_u$, the under-sampled Fourier transform. For simplicity the added feature is positioned in the unoccupied space as demarcated by mask $\Omega_g$. The second term in Eqn. 3 penalizes deviation of the solution from the known feature at applicable voxel locations. A natural choice for g is a flat zero-amplitude profile. Other choices may include a profile with distributed local "bumps", a profile corresponding to a significantly sized resolution phantom, a profile with voxel centers assuming i.i.d. random values, and profiles adaptively/iteratively designed with guidance from preliminary reconstruction or self-validation outcome(s).

Figure 6:
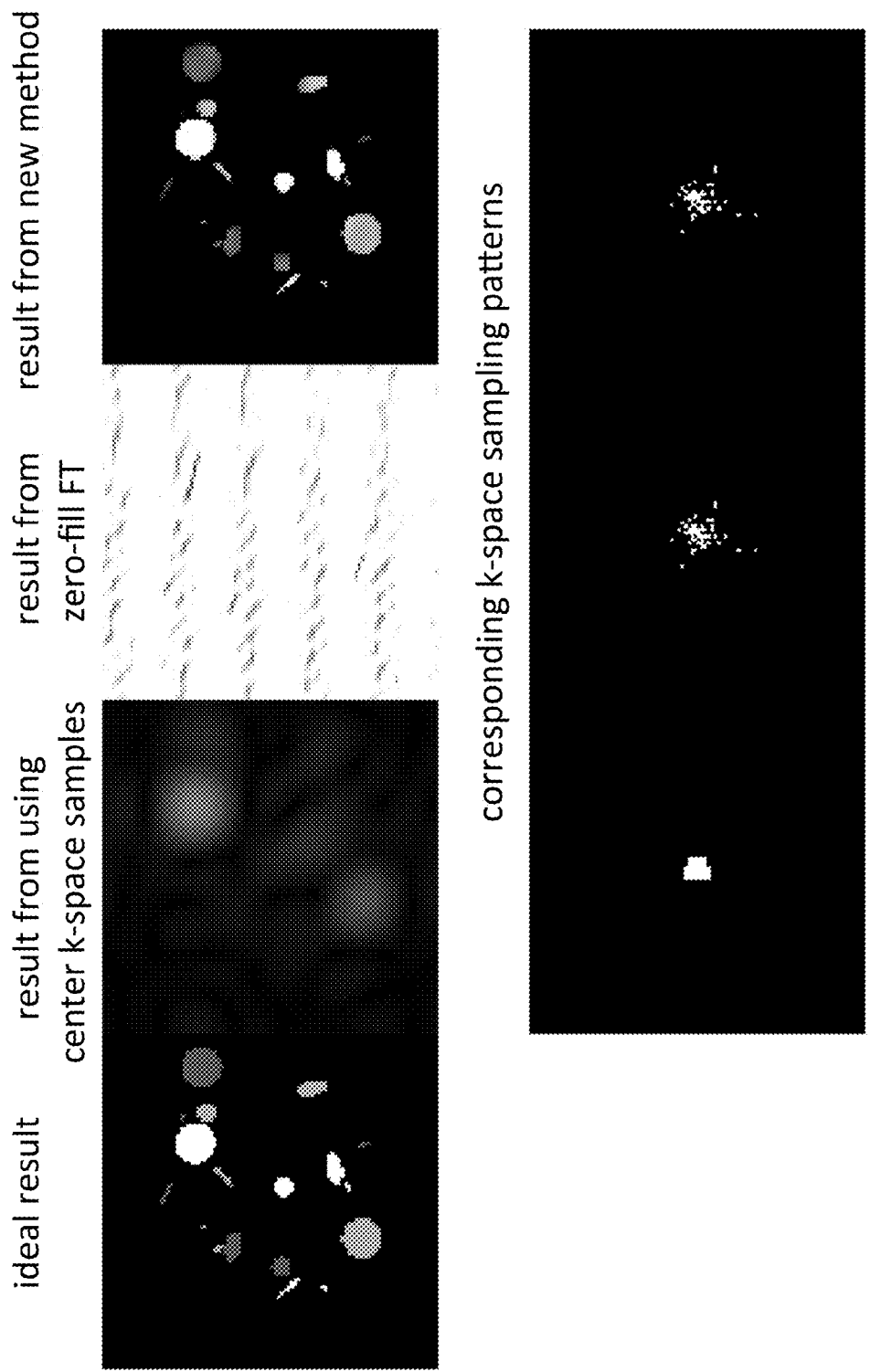
FIG. 6 is an illustration of improved compressed sensing with the introduction of known features.

FIG. 6 illustrates improved compressed sensing with the introduction of known features, with an MR angiogram simulation similar to that shown in FIG. 5 but with highly accelerated data acquisition. FIG. 6 top-right shows the Eqn. 3-based reconstruction result. By emphasizing accurate recovery of the known features (in this case g=flat zero-amplitude profile in the unoccupied space), the encoding and decoding scheme worked well at a remarkable acceleration of 200-fold.

Parallel Acquisition Signal Structure

Owing to a multi-sensor setup parallel MRI engenders unique characteristics in its signals, providing significant opportunities to devising and optimization of mathematical modeling and to improvement of imaging speed, SNR and quality.

Parallel MRI maps transverse magnetization and reconstructs MR images by processing radio-frequency MR signals that are acquired in parallel with multiple receive channels. For any one of the channels, its spatially varying detection sensitivity causes the channel to sense an intermediate spectrum that results from a convolution of the transverse magnetization's spectrum with a kernel. For all of the parallel receive channels, the spectra sensed by them differ from one another only by convolution effects due to the channels' sensing profiles. In parallel acquisition MR signals, and in Ξ, the spectra sensed by the parallel receive channels, a structure is thereby embedded.

The receive channels' sensing profiles, arising from radio-frequency B1⁻ fields, usually assume smooth weighting profiles in the image-space and narrow-width convolution kernels in the k-space. The embedded structure to a certain extent manifests as an intrinsic redundancy, allowing coarse (i.e., lower than full Nyquest rate) sampling of k-space and thereby acceleration of magnetic resonance imaging.

Central to a conventional parallel MRI method is a full calibration that entails a) sampling of a center k-space region at full Nyquest rate, and b) a reconstruction that subsequently uses the knowledge learned over the region, in the form of image-space sensing profiles or k-space interpolation kernels, to compensate for the coarse sampling and generate MR images. There are limitations to this calibration-reconstruction paradigm in terms of accuracy, speed, flexibility and SNR.

Based on a concept of parallel acquisition signal structure, the new parallel MRI methods hereby described exploit the intrinsic signal structures in Ξ and generate full Ξ and MR images with a general scheme that overcomes conventional methods' limitations.

FIG. 7 illustrates the concept of parallel acquisition signal structure with an MRI example. FIG. 7A: A k-space sampling pattern defines, for a multi-channel parallel acquisition, sampled locations 701 and skipped locations 702. Compared to sampling at a full Nyquest rate, skipping of some of the grid point locations allows the acquisition to go faster. Samples at skipped locations are not directly known but potentially reconstructable. A parallel acquisition signal structure can be identified and exploited through a conceptual stencil 703 dissecting the k-space.

FIGS. 7B and C: For any one of the parallel signal acquisition channels, its spatially varying sensitivity causes it to sense an intermediate spectrum 704 that results from a convolution of a shift-invariant kernel 706 with the transverse magnetization's spectrum. The stencil 703 in the present example is a block arrow that covers 18 grid points for each channel at each placement location. At one placement location, the result 705 of the convolutions in the stencil-demarcated neighborhood is known. This makes an instance that contributes to signal structure identification, despite a lack of knowledge of the kernels (one per channel) and the relevant portion 707 of the transverse magnetization's spectrum.

FIG. 7D: The convolution principle gives rise to a mathematical expression for describing relationship between k-space grid samples. In particular, for any given stencil a shift-invariant matrix K exists that relates samples of Ξ to samples of the magnetization's spectrum with equation $d_i = K x_i$, where i is a location index for the stencil placement over the k-space grid, $d_i$ contains known or unknown samples of Ξ collected by the stencil, and $x_i$ contains samples of the magnetization's spectrum in a support neighborhood defined by the stencil and the convolution kernels. The placement location illustrated in FIG. 7B corresponds to a known $d_i$. A placement location corresponds to a partially known $d_i$ if the stencil-demarcated neighborhood is under-sampled. With a sufficient number of known $d_i$'s, one can identify the column space of K, and reconstruct Ξ and MR images.

As FIG. 7 illustrates, a parallel acquisition signal structure may be revealed and exploited through a conceptual stencil dissecting the k-space. For any one of the parallel signal acquisition channels, its spatially varying sensitivity causes it to sense an intermediate spectrum that results from a convolution of a kernel with the transverse magnetization's spectrum. In accordance with this convolution principle, for any given stencil a shift-invariant matrix K exists that relates samples of Ξ to samples of the magnetization's spectrum:

$$d_i = K x_i, \forall i \quad \text{[Exemplary equation 4]}$$

where i is a location index for the stencil placement over the k-space grid, $d_i$ contains samples of $\Xi$ collected by the stencil, and $x_i$ contains samples of the magnetization's spectrum in a support neighborhood defined by the stencil and the convolution kernels.

Eqn. 4 arises from the convolution principle and involves no other assumptions. The linear equation form is generally valid in describing k-space grid samples. The stencil as illustrated in this example case is a block arrow. However numerous other shapes, including ones extending in three dimensions, can be appropriate choices for a stencil.

The number of rows in K is equal to $n_s \times N$, where $n_s$ is the number of samples the stencil collects from a channel's spectrum at one placement location ($n_s=18$ in FIG. 7), and N is the number of parallel receive channels. The number of columns in K, denoted as $n_K$, is equal to the number of samples in the support neighborhood where the magnetization's spectrum contributes to the $n_s \times N$ samples. Note that $r_K$, the dimension of the column space of K or the number of independent columns in K, is less or equal to $n_K$. In an example case where kernels are as broad as w-point across and the dissecting stencil is an l-point wide square stencil, $n_K \leq (l+w-1)^2$.

The physics of sensitivity weighting gives rise to a projection-invariance property. Expressing $d_i$ as a weighted sum of the columns of K, Eqn. 4 states that $d_i$ belongs to the column space of K, i.e., the vector space spanned by K's column vectors. Thus Eqn. 4 equivalently states that the projection of $d_i$ onto the column space of K results in $d_i$. This projection invariance may be expressed as follows:

$$d_i = P d_i, \forall d_i \quad \text{[Exemplary equation 5]}$$

where matrix P denotes the projection. One way to construct P is through a product $P = UU^H$, where columns of matrix U are vectors of an orthonormal basis for the column space of K and $^H$ denotes complex conjugate. For parallel MRI it is typically neither possible nor necessary to unambiguously resolve K. Yet identifying the column space and confining $d_i$'s to the space can help resolve unknowns and contain noise, exerting anchoring power in $\Xi$ reconstruction.

Parallel MRI: COMPASS

COMpletion with Parallel Acquisition Signal Structure, or COMPASS, represents one class of methods for reconstructing $\Xi$ from an under-sampled version as acquired by parallel MRI. With COMPASS, a signal structure space, or the vector space spanned by the columns of K, is explicitly identified from available samples of $\Xi$ and is then applied to reconstruct $\Xi$ and MR images. Several exemplary embodiments and their variations are presented in this section.

Identification Principle:

Wherever supported fully by available samples of $\Xi$ the stencil assembles the samples into a vector belonging to the signal structure space, adding to the knowledge of the latter. This can be appreciated by organizing multiple such instances as follows:

$$D_{ID} \stackrel{def}{=} [d_1 d_2 \ldots ] = K[x_1 x_2 \ldots ], \quad \text{[Exemplary equation 6]}$$

where, in the identification process, $D_{ID}$ (whose columns are made of known $d_i$'s) is known. It is clear that, despite the lack of knowledge of the x's, when there are enough instances to allow assembly of $r_K$ independent column vectors for $D_{ID}$ the signal structure space can be identified and a U matrix determined. For the sampling pattern and stencil definition illustrated in FIG. 7, in identifying the signal structure space the six clusters shown support 30+ instances of stencil placements hence a $D_{ID}$ matrix with 30+ columns.

In practice, U can be determined with, for example, QR factorization or SVD of matrix $D_{ID}$. Even though diversity of neighborhoods in the magnetization spectrum implies that $r_K$ independent column vectors may well result from as few as $r_K$ instances, in the presence of measurement noise, it is useful to employ more instances and hence more known $d_i$'s to strengthen the robustness of the identification process. For this SVD of $D_{ID}$ with thresholding can be handy, where one ranks the singular values and attributes the basis vectors associated with the more significant singular values as the ones spanning the signal structure space.

Reconstruction Principle:

Eqn. 4, and equivalently Eqn. 5, is valid everywhere. Consider a k-space sweep. At each step of the sweep the stencil assembles samples, acquired or unknown, and constrains the resulting vector to be in the identified signal structure space. A full sweep gives a full set of constraints:

$$d_i = UU^H d_i, \quad i=1,2,\ldots \quad \text{[Exemplary equation 7]}$$

FIG. 8 illustrates example reconstruction formulations. (A) Reconstruction as a problem of finding the least squares solution to a set of equations. This set of equations is formed by pooling together subsets of equations, including one that expresses constraints due to the signal structure, one that expresses constraints due to the measured data samples, and, if applicable, additional ones that capture physics, statistics or other knowledge. (B) Reconstruction as an optimization problem. The objective function includes terms that capture outcome's deviation from the signal structure model, from the measurements, and from additional models. The optimization flexibly accommodates regularization/other spatial or temporal models that capture physics, statistics or other knowledge.

Mathematical conversions can facilitate the computation involved in imposing the full set of constraints due to the identified signal structure. With the identified U matrix, $UU^H$, the projection operator is known. Eqn. 7 ties any sample, in a known, shift-invariant fashion, to weighted sums formed in the sample's neighborhoods in the spectra. This therefore gives rise to a set of N constraints in convolution form:

$$\begin{cases} z^{(1)} = w^{(1,1)} \otimes z^{(1)} + w^{(1,2)} \otimes z^{(2)} + \ldots + \\ \quad w^{(1,N)} \otimes z^{(N)} \\ \vdots \\ z^{(N)} = w^{(N,1)} \otimes z^{(1)} + w^{(N,2)} \otimes z^{(2)} + \ldots + \\ \quad w^{(N,N)} \otimes z^{(N)} \end{cases} \quad \text{[Exemplary equation 8]}$$

where $z^{(n)}$ represents the spectrum in $\Xi$ that corresponds to the nth channel, $\otimes$ denotes convolution, and the w's are the convolution functions derived from U. Fourier transform further converts the convolution operations into spatial weighting operations in image space, giving rise to a set of N rapidly quantifiable constraints on the individual channel images:

$$\begin{cases} y^{(1)} = w^{(1,1)} \times y^{(1)} + w^{(1,2)} \times y^{(2)} + \ldots + \\ \quad w^{(1,N)} \times y^{(N)} \\ \vdots \\ y^{(N)} = w^{(N,1)} \times y^{(1)} + w^{(N,2)} \times y^{(2)} + \ldots + \\ \quad w^{(N,N)} \times y^{(N)} \end{cases} \quad \text{[Exemplary equation 9]}$$

In Eqn. 9, $y^{(n)}$, the image corresponding to the nth channel, represents the inverse Fourier transform of $z^{(n)}$, and $W^{(m,n)}$, the $(m,n)^{th}$ spatial weighting function, represents inverse Fourier transform of $w^{(m,n)}$.

Transformed from Eqn. 7, the convolution form (Eqn. 8) or the weighted superposition form (Eqn. 9) expresses the signal structure constraints due to imaging physics. For reconstructing $\Xi$ and images, imposing the signal structure constraints by applying Eqn. 4, 5 or 7 everywhere is equivalent to imposing the set of N constraints with Eqn. 8 or 9. Use of Eqn. 9 offers a notable advantage in computation efficiency owing to the $N^2$ low-cost weighting operations. This advantage is amplified when the constraints need to be repeatedly evaluated, as is often the case when the reconstruction employs an iterative numerical solver.

Let y=Wy, (I−Ω)z=b, and z=Fy or y=F$^{-1}$z be the matrix notations representing, respectively, Eqn. 9, k-grid under-sampling, and Fourier transform relationships between the $z^{(n)}$'s and $y^{(n)}$'s. In these expressions, y pools $y^{(n)}$'s, z pools the channels' spectra, matrix F and F$^{-1}$ represent (N-channel) Fourier and inverse Fourier transforms respectively, b pools the channels' spectra as acquired by parallel receive (zero-filled, i.e., with none-zero entries being the acquired measurements and zero entries being the skipped measurements), I is the identity matrix, and diagonal matrix (I−Ω) denotes the k-grid sampling using 0's and 1's.

The set of constraints due to the governing signal structure, along with the set of constraints due to the measured, under-sampled spectra, form a set of linear equations (FIG. 8A). Said set of linear equations can be cast with the parallel receive channels' spectra as unknowns:

$$\begin{bmatrix} \alpha(I-W)F^{-1} \\ I-\Omega \end{bmatrix} z = \begin{bmatrix} 0 \\ b \end{bmatrix} \quad \text{[Exemplary equation 10]}$$

or, alternatively, with the parallel receive channels' images as unknowns:

$$\begin{bmatrix} \alpha(I-W) \\ (I-\Omega)F \end{bmatrix} y = \begin{bmatrix} 0 \\ b \end{bmatrix} \quad \text{[Exemplary equation 11]}$$

A least-squares solution to either set leads to reconstruction of $\Xi$, and individual and combined images. There are a variety of numerical algorithms that support solving the least squares problems. Some of the numerical algorithms (e.g., lsqr) are particularly efficient as they accept W, Ω, F and F$^{-1}$ that are implemented as operators and scale gracefully with problem size. Parallel computing technology readily supports speedup of N-channel Fourier and inverse Fourier transforms, which also helps accomplish a high reconstruction speed.

Figure 9:
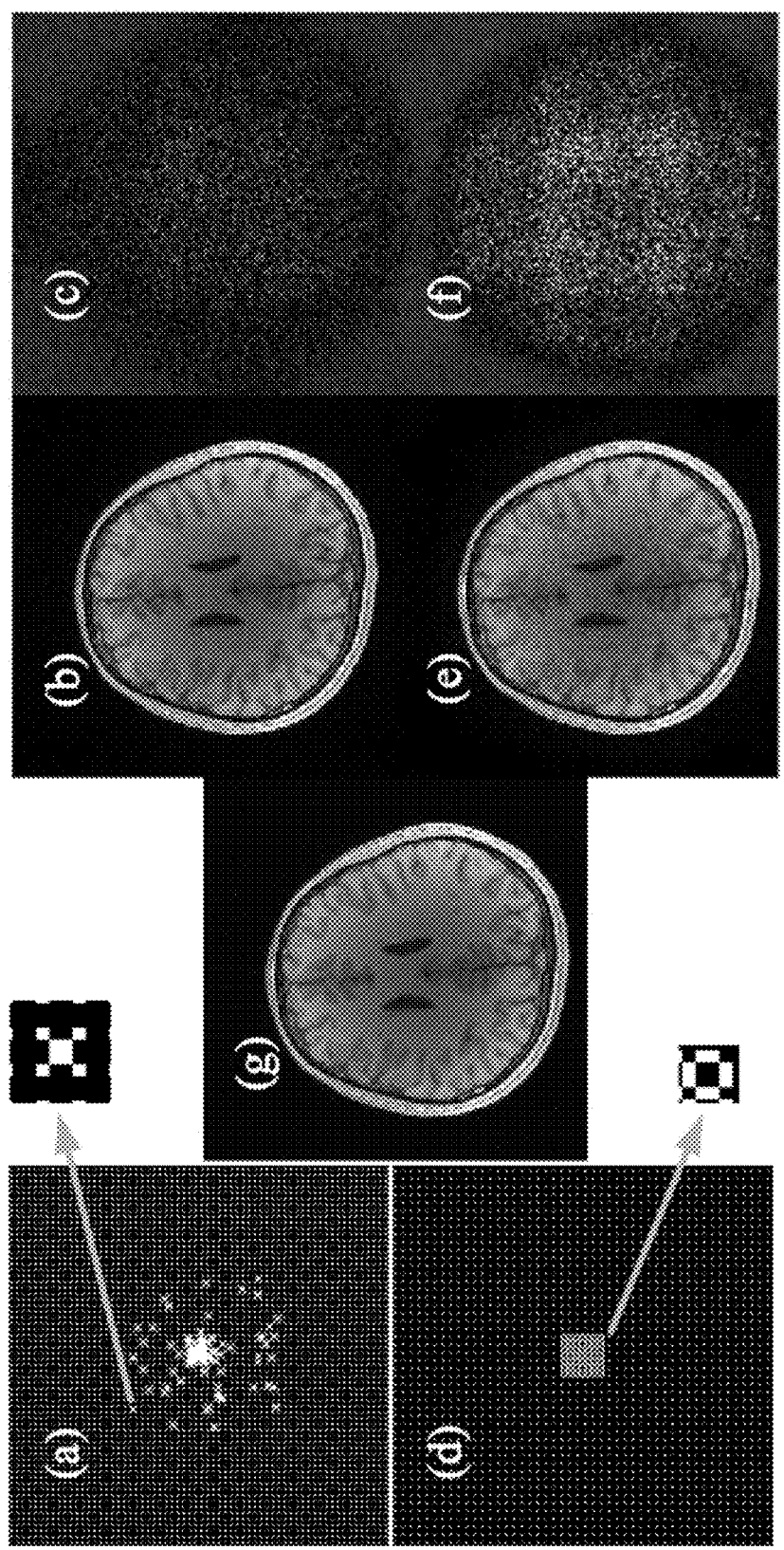
FIG. 9 is an illustration of an example of applying COMPASS in a brain MRI.

FIG. 9 shows a brain MRI example where a 32-channel coil was used for parallel acquisition of in vivo data samples. The result from a full-sampling case was available (g) to serve as a reference. (a-c) summarizes a first acceleration case: (a) 8.7× under-sampling pattern and 8-point stencil, (b) COMPASS result, and (c) |result-reference|×10. (d-f) summarizes a second acceleration case: (d) 15.1× under-sampling pattern and 8-point stencil, (e) COMPASS result, and (f) |result-reference|×10. Notice the satisfactory reconstruction accuracy despite a lack of center k-space full sampling. SNR in the 15.1× case is lower than that in the 8.7× case, as expected.

Alternatively expressing reconstruction as an explicit optimization problem (FIG. 8B) can be useful. Eqns. 10 and 11, in explicit optimization forms, can additionally incorporate regularization/other models, including spatial or temporal models that capture physics, statistics or other knowledge. For instance:

$$\operatorname{argmin}_y \alpha^2 \|(I-w)y\|_2^2 + \|(I-\Omega)Fy-b\|_2^2 + \text{penalty term(s)}$$
based on additional model(s) [Exemplary equation 12]

In incorporating a sparse model for regularization, Eqn. 12 may include, for example, a penalty term $\Sigma_n \lambda^{(n)} \|\Psi y^{(n)}\|_1$ where $\Psi$ represents a sparsifying transform.

Divide-and-conquer strategies are applicable. For example, one can use Eqn. 10 to reconstruct $\Xi$ segment-by-segment. With such a scheme one divides $\Xi$ into contiguous or overlapped segments, solves smaller reconstruction problems rather than one full-size problem, and stitches the results together to reconstruct the full $\Xi$. The smaller reconstruction problems can be solved in parallel using parallel computing technology, each involving a fraction of all the measured data samples and to-be-determined unknowns.

In a case involving sampling off a Cartesian grid, regional re-gridding applied to sample cluster(s) of sufficient density can generate $d_i$'s and enable the determination of U and W. In Eqns. 10 and 11, (I−Ω)z=b and (I−Ω)Fy=b are then to be replaced by EF$^{-1}$ z=$b_a$ and Ey=$b_a$, respectively, where E represents the encoding matrix corresponding to the non-Cartesian sampling pattern and $b_a$ collects sample data acquired by parallel receive.

COMPASS enables recognition and best balancing of model and measurement uncertainties. Impact of measurement noise on reconstruction is mediated by the two distinct sets of constraints (or more if additional models are introduced). Scalar a can be set to emphasize the more reliable one of the two to benefit image SNR. In a case where the first set is very reliable, e.g., due to a robust scheme for signal structure identification or an effective incorporation of other sources of knowledge, choosing a large a can be beneficial. In such a case one can analytically track noise propagation, predict image noise standard deviation and introduce further optimizations.

Further adapting the first or second set of constraints can be useful. For example, one may design and apply multiple stencils to optimize structure space identification, to optimize the structure space's anchoring effect on the reconstruction, or to improve the efficiency of k-space sampling. In such a multi-stencil case, the adaptation to Eqns. 10 and 11 for example may give $$\begin{bmatrix} \alpha_1(I-W_1)F^{-1} \\ \vdots \\ \alpha_L(I-W_L)F^{-1} \\ 1-\Omega \end{bmatrix} z = \begin{bmatrix} 0 \\ \vdots \\ 0 \\ b \end{bmatrix} \quad \text{[Exemplary equation 13]}$$

and

-continued $$\begin{bmatrix} \alpha_1(I-W_1) \\ \vdots \\ \alpha_L(I-W_L) \\ (1-\Omega)F \end{bmatrix} y = \begin{bmatrix} 0 \\ \vdots \\ 0 \\ b \end{bmatrix}$$ [Exemplary equation 14]

Given the afore-described reconstruction principle, it is clear that as long as the sensitivity profiles stay the same the samples used in the structure space identification can be acquired in one or more sessions that are separate from the session(s) that produce b. For example the session(s) involved in the identification can take place at a different time and/or assume a different MR image contrast. This, in conjunction with the numerous possibilities for designing/combining stencils and for assembling/organizing $D_{ID}$'s (Eqn. 6), allows for MRI enhancements in terms of flexibility and efficiency. As a further note, the reconstruction principle is supportive of a more general k-space sampling scheme in which the acquisition channels each has its own sampling pattern—such a scheme for example accommodates more flexible deployment of the receive channel resource when the number of receive channels is less than the number of coil ports.

Diagnostic applications commonly demand reconstruction result in the form of a combined image rather than a set of individual channel images. A concept of synthesized channel(s) can be introduced into COMPASS to facilitate the creation, regularization and analysis of useful combined image(s). Under a setting where a desired combination captures a spatially weighted version of the transverse magnetization or a weighted superposition of individual channel images, a synthesized channel can be designated and Eqn. 4 remains a valid form in describing k-space grid samples from both actual and synthesized channels. The identification and reconstruction principles apply, and COMPASS can directly create the combination instead of deferring it to a separate combination step.

Consider √sum of squares of individual channel images (√sos), a common combination, as an example. Typically √sos is calculated in a separate step after the individual channel images are reconstructed. It can be shown however that √sos is a spatially weighted version of the transverse magnetization as well as a weighted superposition of individual channel images. Illustrated below are two integrated, linear approaches to √sos creation.

A first approach uses a synthesized channel in reconstruction. The channel is appended to the N actual receive channels—hence Ξ represents spectra of N+1 channels, the number of rows in K in Eqn. 4 is $n_s \times (N+1)$, and z and y (Eqns. 10 and 11) both have N+1 channels' worth of unknowns. COMPASS proceeds as if there are N+1 parallel receive channels except for two modifications. In identification: The synthesized channel's spectrum (needed as part of the input) is emulated, e.g., by sampling FT {√sum of squares of $FT^{-1}$ {individual spectrum acquired by actual channels}} with the same k-space sampling pattern that is in effect for the actual channels. In reconstruction: To accommodate the synthesized channel, I, Ω and b are augmented as if there is an additional receive channel that is with a skip-all sampling pattern (i.e., Ω and b are zero-padded). Matrix W resulting from the identification then has the effect of substantiating spectra/images of all N+1 channels through Eqn. 10 or 11.

A second approach adapts Eqn. 10 or 11 with an additional set of equations that explicitly describes the weighted superposition relationship:

$$\begin{bmatrix} \alpha(I-W)F^{-1} & 0 \\ \beta RF^{-1} & -\beta F_1^{-1} \\ I-\Omega & 0 \end{bmatrix} \begin{bmatrix} z \\ z_c \end{bmatrix} = \begin{bmatrix} 0 \\ 0 \\ b \end{bmatrix}$$ [Exemplary equation 15]

or, $$\begin{bmatrix} \alpha(I-W) & 0 \\ \beta R & -\beta I \\ (I-\Omega)F & 0 \end{bmatrix} \begin{bmatrix} y \\ y_c \end{bmatrix} = \begin{bmatrix} 0 \\ 0 \\ b \end{bmatrix}$$ [Exemplary equation 16]

The additions reflect $y_c = Ry$, a matrix notation for $y_c = R^{(1)} \times y^{(1)} + \ldots + R^{(N)} \times y^{(N)}$, i.e., the combined image is a weighted superposition of individual channel images. Alternatively, there are ways to estimate a set of sensitivity profiles consistent with the acquired samples or the signal structure, which supports use of $y = Sy_c$ instead of $y_c = Ry$. $y = Sy_c$ is a matrix notation for expressing $y^{(1)} = S^{(1)} \times y_c, \ldots$, and $y^{(N)} = S^{(N)} \times y_c$. Considering the effects of noise, the illustrated integration avoids over-enforcement of $y_c = Ry$ or $y = Sy_c$ when either one is integrated into COMPASS. β, a positive scalar allows optimization of the enforcement.

For solving each of Eqns. 10-11 and 13-16 with least squares, a prediction of a solution's noise covariance or standard deviation can be performed by computing $(A^H A)^{-1}$ where A denotes the matrix on the left-hand side of the equation being solved. There exist numerical algorithms that support cost-effective computation of $(A^H A)^{-1}$.

From an SNR point of view, maximizing SNR/robustness against measurement noise may entail further optimization of the measurement scheme (e.g., the under-sampling pattern), joint design of stencil(s) and the under-sampling pattern, the identification scheme, or an optional regularization scheme (e.g., L2 or L1 norm-based). Guidance from noise behavior prediction is most valuable. It enables assessment and optimization of SNR in a proactive fashion, once there are enough data samples or knowledge for signal structure identification. For example, the integrated, linear computation of the synthesized channel's spectrum (Eqn. 15) facilitates prediction of noise covariance, which, in turn, can guide adaptation of k-space sampling for SNR improvement.

FIG. 10 illustrates noise behavior prediction and α's impact on COMPASS' SNR behavior with a 1D simulation case. The case was set up with magnetization and sensitivity profiles over a line segment extracted from a 2D 8-channel parallel MRI case, and with 4× even under-sampling of k-space. Under a setting where noise effect on structure identification was negligible, the analytical predictions suggested that image noise standard deviation would decrease monotonically as a increases from $10^0$ to $10^8$ (FIG. 10). Image noise standard deviation independently measured with a Monte Carlo study confirmed this (FIG. 10b overlay of dots), and further indicated that as the noise effect to the structure identification increased, image noise profiles deviated more and more from the analytical predictions starting at several discrete locations.

Using first principle and refraining from unnecessary or untimely introduction of assumptions, COMPASS offers a framework for accuracy, speed, flexibility and SNR improvements. There are various other exemplary embodiments, including, for example, exemplary embodiments that alternatively formulates the reconstruction as:
 a) solving $FWF^{-1}z=z$ subject to $(I-\Omega)z=b$, or
 b) iterating $z^{(n+1)}=(FWF^{-1})(\Omega z^{(n)}+b)$, with $z^{(0)}=b$, or
 c) solving $(I-FWF^{-1}\Omega)z=FWF^{-1}b$, or
 d) calculating $z=\lim_{n\to\infty}(\Sigma_{k=0}^{n}P^k)b$, where $P=\Omega FWF^{-1}$.

Parallel MRI: Methods Leveraging Randomness

As described above COMPASS accommodates random or incoherent k-space sampling and there are embodiments of COMPASS that incorporate compressed sensing to take further advantage of random or incoherent k-space sampling.

For reconstructing $\Xi$ from a partially measured version, methods described below employ low-rank matrix completion and emphasize exploitation of random or incoherent k-space sampling. Similar to COMPASS they eliminate the requirements of a conventional calibration and the determination of profiles and kernels. Nonetheless, they represent that the signal structure space is of low-rank but avoid further determination of a basis for the space. Reconstruction of $\Xi$ is accomplished by enforcing the low-rank model with a low-rank matrix completion algorithm, which necessarily relies on an acquisition scheme that samples k-space grid with an incoherent under-sampling pattern.

The analysis in section Parallel Acquisition Signal Structure is fully applicable here. Eqn. 4, and equivalently Eqn. 5, is valid everywhere over the grid. Consider sweeping a stencil across a $\Xi$ segment that is of a sufficiently large size. At each step of the sweep the stencil assembles samples, acquired or unknown, and constrains the resulting vector to conform to the linear form $d_i=Kx_i$. Pooling the results together gives a data matrix D:

$$D \stackrel{def}{=} [d_1 d_2 \ldots ]=K[x_1 x_2 \ldots ]$$ [Exemplary equation 17]

Due to the acquisition scheme, D's columns have known and unknown entries appearing in a pseudo-random fashion. If the acquisition were an ideal, full sampling of the k-space grid, D would have a rank no greater than $r_K$. In other words, the assembled D is an under-sampled version of a low-rank matrix. Low-rank matrix completion is a standard mathematical tool that can be employed for resolving the unknown entries of D.

In an exemplary embodiment a parallel acquisition scheme is employed to acquire samples over a k-space grid with an incoherent under-sampling pattern. For reconstruction, the full k-space grid is partitioned into multiple segments that may exhibit overlaps or be of different sizes. For each segment, sweeping a stencil across the segment causes a data matrix to be assembled. The assembled matrix represents an incoherently under-sampled version of a low-rank matrix. Entries of the assembled matrix not filled due to coarse sampling are set to zero initially. These entries are updated and the $\Xi$ segment recovered using low-rank matrix completion, with self-validation applied when desired. As a special case, the reconstruction may treat the full k-space grid as one single segment.

There is the option to process some of the segments together, e.g., using a strategy of anchoring, i.e., concatenating into one matrix the data matrices from both the segment being reconstructed and a selected segment that is sampled with acquisition timing of interest or with high signal/SNR, and completing the composite matrix—see Eqn. 18 for an illustration. There is also the option to process all the segments entirely independent of one another—see Eqn. 19 for an illustration.

low rank matrix completion of $[D_{anchor}, D_i]$ and
 reconstruction of the ith segment [Exemplary equation 18]

low rank matrix completion of $D_i$ and reconstruction
 of the ith segment [Exemplary equation 19]

The data matrices corresponding to the segments have the common low-rank structure resulting from location-independent convolution kernels. Each segment is self-contained, and fully reconstructable by enforcing the low-rank structure. No calibration or determination of profiles or kernels is necessary. No explicit identification of structure is necessary either. Stitching the processed segments together leads to the reconstruction of full $\Xi$ and full-resolution images.

Figure 11:
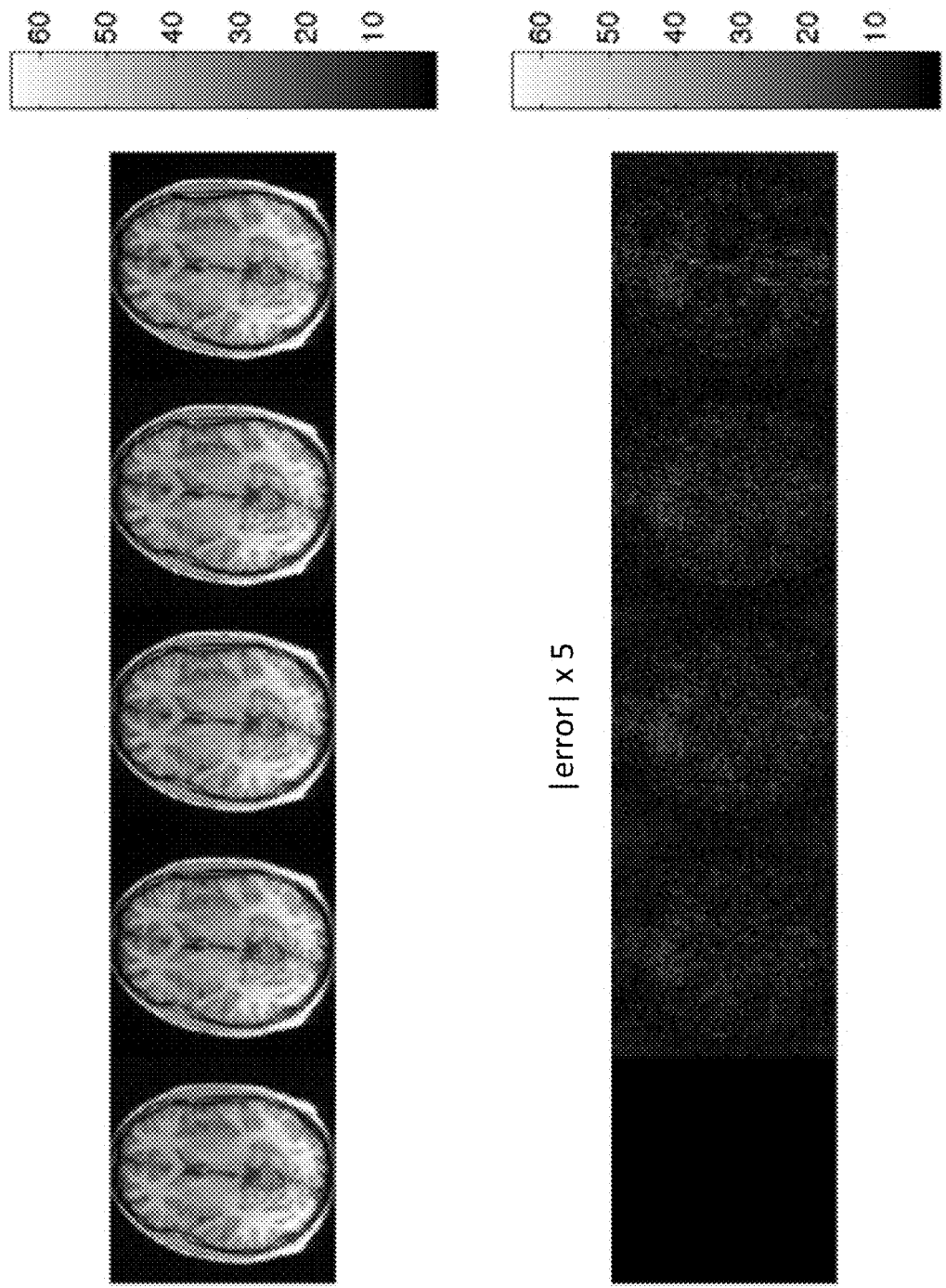
FIG. 11 is an illustration of an example of applying low-rank matrix completion in parallel MRI.

FIG. 11 illustrates an example of applying low-rank matrix completion in parallel MRI. In acceleration of 2D phase encoding in 8-channel parallel receive MRI of a brain, a 200×200 k-space grid was sampled with incoherent under-sampling patterns that correspond to 2.5-fold accelerations over full sampling. As a comparison reference FIG. 11 col. 1 displays the result from applying standard sum-of-squares reconstruction to fully sampled 8-channel data. For the accelerated imaging cases, the reconstruction partitioned the full grid into up to 25 regions, and employed low-rank matrix completion instead of calibration and profile or kernel determination. Results from the cases were compared to the reference to quantify errors. FIG. 11 col. 2 shows the result from the case where the entire grid was treated as a single segment. FIG. 11 col. 3 shows the result from the case where 25 segments that made the whole grid were individually reconstructed. Each individual reconstruction was anchored (Eqn. 18) by data incoherently under-sampled on a 48×48 grid at center k-space. FIG. 11 col. 4 shows the result from the case where 9 segments that made the whole grid were individually and independently reconstructed (Eqn. 19). Reconstruction of each of the 8 outer k-space segments was self-reliant, without any knowledge of what happened elsewhere. FIG. 11 col. 5 shows the result from the case that was the same as the previous, except for the use of segment-dependent thresholds when a singular value thresholding algorithm was applied to solve low rank matrix completion.

Reconstruction in the segment-by-segment fashion is amenable to parallel computing. Additional ways to accelerate the reconstruction include incremental SVD update techniques, where a small, yet-to-be-completed data matrix is appended to an already-completed data matrix, and the composite data matrix is completed through a low-cost SVD update.

Additional ways to accelerate reconstruction also include an iterative scheme involving projection of the incomplete columns of the yet-to-be-completed data matrix onto the column-space of the already-completed data matrix and update of the yet-to-be-filled entries while in keeping with the structure.

When random or incoherent sampling is employed, and especially when compressed sensing is employed, COMPASS for parallel MRI can benefit from self-validation, in ways similar to that illustrated in earlier sections with examples.

Low-rank matrix completion can benefit from self-validation as well. In an exemplary embodiment of low-rank matrix completion with self-validation, an S-test checks variations in reconstruction results amongst an ensemble of low-rank matrix completions that each uses a leaving-L-out version of the set of base data samples. This can be clearly appreciated with a parallel MRI example. In accelerating MRI with low-rank matrix completion, an incoherently under-sampled version of the full data matrix is acquired, which is followed by reconstruction of the full data matrix and the underlying image. To assess this base result, the S-test checks standard deviation of the solutions to the following ensemble of problems:

$$\text{low rank matrix completion of } D^{(j)} \text{ and reconstruction of an image, } j=1,2,\ldots \quad \text{[Exemplary equation 20]}$$

where $D^{(j)}$ represents the jth instance of leaving out L k-space sample per receive channel. Except for the leaving-L-out perturbation, each instance of problem in the ensemble is identical to the original problem that yields the base result.

Figure 12:
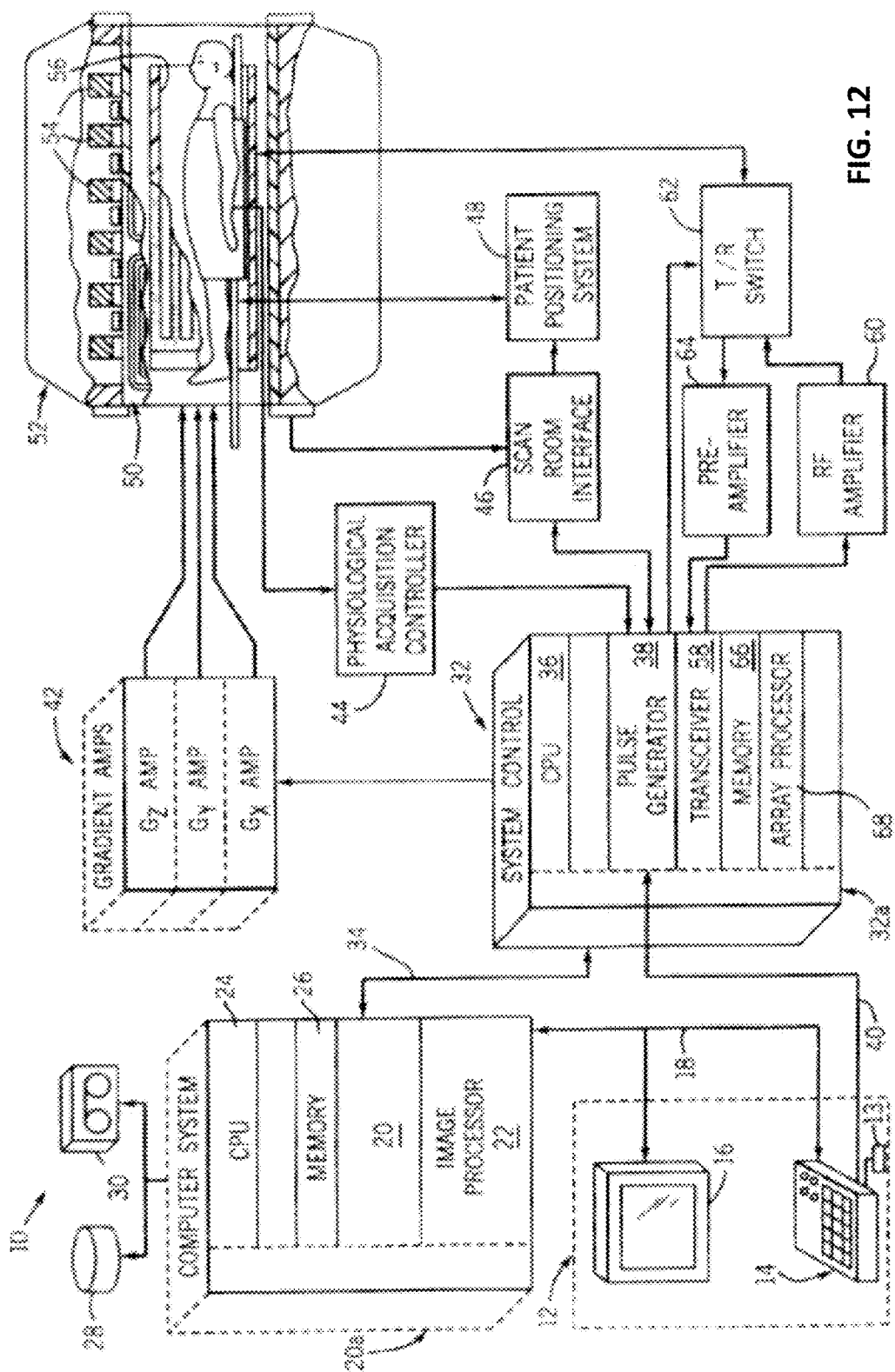
FIG. 12 is a schematic block diagram of a magnetic resonance imaging system for use with the present invention.

Referring to FIG. 12, the major components of an example magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates, for RF transmit, the timing, strength and shape of the RF pulses produced, and, for RF receive, the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 and a polarizing magnet 54 form a magnet assembly 52. An RF coil assembly 56 is placed between the gradient coil assembly 50 and the imaged patient. A transceiver module 58 in the system control 32 produces pulses which are amplified by an RF amplifier 60 and coupled to the RF coil assembly 56 by a transmit/receive switch 62. The resulting signals emitted by the excited nuclei in the patient may be sensed by the same RF coil assembly 56 and coupled through the transmit/receive switch 62 to a preamplifier module 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil assembly 56 during the transmit mode and to connect the preamplifier module 64 to the coil assembly 56 during the receive mode. The transmit/receive switch 62 can also enable a separate RF coil (for example, a surface coil) to be used in either the transmit or receive mode. The transceiver module 58, the separate RF coil and/or the coil assembly 56 are commonly configured to support parallel acquisition operation.

The MR signals picked up by the separate RF coil and/or the RF coil assembly 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data to combine MR signal data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

While the above descriptions of methods and systems contain many specificities, these should not be construed as limitations on the scope of any embodiment, but as exemplifications of the presently preferred embodiments thereof. Many other ramifications and variations are possible within the teachings of the various embodiments.

What is claimed is:

1. A method for producing images and autonomous validations using a medical imaging apparatus, the method comprising:
 a. scanning an object in accordance with a prescribed scanning pattern to acquire a set of base data samples, said scanning being conducted using a medical imaging apparatus selected from the group comprising an MRI scanner, a CT scanner and a PET scanner,
 b. performing perturbation in accordance with a systematic perturbation scheme at least one time to said set of base data samples and obtaining at least one set of perturbed data samples,
 c. operating individually on said at least one set of perturbed data samples with a predetermined reconstruction and obtaining at least one perturbed result,
 d. deriving an outcome based on said set of base data samples and said at least one perturbed result, said outcome comprising at least one image and a fidelity assessment,
 whereby said medical imaging apparatus accomplishes both imaging and validation with said outcome.

2. The method of claim 1 wherein each time of said performing perturbation comprises excluding at least one data sample from said set of base data samples, said at least one data sample being selected in accordance with a predetermined strategy.

3. The method of claim 2 wherein said fidelity assessment comprises a measure of variation in said at least one perturbed result.

4. The method of claim 1 wherein each time of said performing perturbation comprises modifying said set of base data samples, said modifying effects adding a predetermined image feature.

5. The method of claim 4 wherein said fidelity assessment comprises a measure of deviation of said at least one perturbed result.

6. The method of claim 1 wherein said predetermined reconstruction is selected from the group comprising compressed sensing-incorporated reconstruction, low-rank matrix completion-incorporated reconstruction, and incoherent sampling-incorporated reconstruction.

7. The method of claim 1 wherein said medical imaging apparatus is an MRI system that performs compressed sensing.

8. The method of claim 1 wherein said medical imaging apparatus is a diagnostic imaging system that performs compressed sensing.

9. A method of parallel receive magnetic resonance imaging, comprising:
   a. operating an MRI system to acquire data samples with a radio frequency parallel receive apparatus and in accordance with a k-space under-sampling pattern,
   b. applying a stencil to said data samples to form at least one data assembly, said stencil being designed to support aspects of said radio frequency parallel receive apparatus and said acquiring of data samples,
   c. identifying a signal structure in said at least one data assembly, said signal structure being selected from the group comprising a vector space, a basis, a matrix, an operator, a vector space's rank, a matrix's rank, a spatial distribution and a temporal variation,
   d. finding a result consistent with both said data samples and said signal structure, said result being selected from the group comprising a spectrum, a set of spectra, a matrix, an image and a set of images,
   whereby said method overcomes under-sampling effects and provides improvements in acquisition speed, image signal-to-noise ratio or image quality.

10. The method of claim 9 wherein said finding a result comprises solving a set of equations, said set of equations being selected from the group comprising expressions of constraints due to said signal structure, expressions of constraints due to said data samples, and expressions of constraints derived from physics, statistics and other knowledge.

11. The method of claim 10 wherein said finding a result comprises predicting noise covariance of said result.

12. The method of claim 9 wherein said finding a result comprises solving an optimization problem, said optimization problem having terms selected from the group comprising deviation from said signal structure model, deviation from said data samples, and deviation from models that capture physics, statistics or other knowledge.

13. The method of claim 9 wherein said acquiring data samples is conducted by simultaneously acquiring data samples with a set of parallel RF receive channels.

14. The method of claim 9 wherein said finding a result comprises low-rank matrix completion, said low-rank matrix completion being performed for a spectra in a segment-by-segment fashion.

15. The method of claim 9 wherein said finding a result employs predetermined calculations, said predetermined calculations being selected from the group comprising convolution computation, weighted superposition computation, fast Fourier transform (FFT), singular value decomposition (SVD) and convex optimization.

16. The method of claim 9 wherein said finding a result comprises balancing uncertainties amongst models.

17. The method of claim 9 wherein said stencil is designed in conjunction with said k-space under-sampling pattern.

18. The method of claim 9 wherein said signal structure arises in part from modifying said data samples, said modifying effects adding a predetermined feature.

19. The method of claim 9 wherein said k-space under-sampling pattern is selected from the group comprising a pseudo-random sampling pattern, a Cartesian sampling pattern, and a sampling pattern resulting from an arbitrary k-space traversing.

20. A magnetic resonance imaging (MRI) apparatus, comprising:
   a. a hardware system for performing MR signal excitation and parallel detection,
   b. a computer system electrically connected to said hardware system, comprising:
      at least one display;
      at least one processor; and
      non-transitory computer readable media, comprising:
         computer readable code for applying said MR signal excitation and parallel detection,
         computer readable code for causing said hardware system to acquire data samples with a radio frequency parallel receive apparatus and in accordance with a k-space under-sampling pattern,
         computer readable code for forming at least one data assembly by applying a stencil to said data samples, said stencil being designed to support aspects of said radio frequency parallel receive apparatus and said acquiring of data samples,
         computer readable code for identifying a signal structure in said at least one data assembly, said signal structure being selected from the group comprising a vector space, a basis, a matrix, an operator, a vector space's rank, a matrix's rank, a spatial distribution and a temporal variation, computer readable code for finding a result consistent with both said data samples and said signal structure, said result being selected from the group comprising a spectrum, a set of spectra, a matrix, an image and a set of images, and
         computer readable code for converting and displaying said result on said at least one display.

* * * * *